(12) United States Patent
Shen et al.

(10) Patent No.: US 6,493,845 B1
(45) Date of Patent: Dec. 10, 2002

(54) PARALLEL INPUT OUTPUT COMBINED SYSTEM FOR PRODUCING ERROR CORRECTION CODE REDUNDANCY SYMBOLS AND ERROR SYNDROMES

(75) Inventors: Ba-Zhong Shen, Shrewsbury, MA (US); Lih-Jyh Weng, Shrewsbury, MA (US); Diana L. Langer, Northborough, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/337,122

(22) Filed: Jun. 21, 1999

(51) Int. Cl.[7] .............................................. H03M 13/00
(52) U.S. Cl. ..................................... 714/784; 714/785
(58) Field of Search ................................. 714/746, 752, 714/758, 781, 784, 785, 757, 761; 708/492

(56) References Cited

U.S. PATENT DOCUMENTS

| 5,331,645 A | * | 7/1994 | Miller et al. | 371/37.1 |
| 5,444,719 A | * | 8/1995 | Cox et al. | 371/37.1 |
| 5,757,826 A | * | 5/1998 | Fredrickson | 371/37.11 |
| 5,901,158 A | * | 5/1999 | Weng et al. | 371/37.12 |
| 5,912,905 A | * | 6/1999 | Sakai et al. | 371/37.11 |

OTHER PUBLICATIONS

Fettweis and Hassner, A Combined Reed–Solomon Encoder and Syndrome Generator with Small Hardware Complexity, pp. 1873 Circuits and Systems, 1992. ISCAS '92. Proceedings., 192 IEEE International Symposium on , vol. 4.*

* cited by examiner

*Primary Examiner*—Albert Decady
*Assistant Examiner*—Matt Dooley
(74) *Attorney, Agent, or Firm*—Cesari and McKenna, LLP

(57) ABSTRACT

A parallel input/output combined encoding and syndrome generating system encodes two information symbols per clock cycle, and thereafter, produces two redundancy symbols per clock cycle. For an n-symbol code word with 2k information symbols $c_{n-1}$, to $c_{n-2k}$, the symbols $c_{n-1}$, $c_{n-3}$, $c_{n-5}$ ... are supplied, in turn, to a first input line while the symbols $c_{n-2}$, $c_{n-4}$, $c_{n-6}$, ... are supplied, in turn, to a second input line. In a first clock cycle, the symbol $c_{n-1}$ is combined with the contents of the R registers, where R is the number of redundancy symbols, and the contents are multiplied by the respective roots of the generator polynomial. The products then are combined with the paired symbol $c_{n-2}$ and the resulting sums are multiplied also by the roots of the generator polynomial. These products are then summed in a chain of R adders and the respective registers are appropriately updated with the results of the encoding of the two symbols. During the next clock cycle, the next pair of information symbols are encoded, with $c_{n-3}$ supplied to the first input line and $c_{n-4}$ supplied to the second input line, and so forth. During the $k^{th}$ clock cycle, when the last of the pairs of information symbols are being encoded, the system produces the first two redundancy symbols. The first redundancy symbol is the update value for the last register $r_{R-1}$, and the system then manipulates the update value, to produce the second redundancy symbol in the same clock cycle. The pair of redundancy symbols are next fed back to the two input lines and encoded, as discussed above. For decoding, the chain of R feedback adders is broken, and each set of adders and multipliers operates separately to update the associated register with the results of the manipulation of two code word symbols per clock cycle.

29 Claims, 10 Drawing Sheets

PARALLEL INPUT OUTPUT COMBINED SYSTEM FOR PRODUCING ERROR CORRECTION CODE REDUNDANCY SYMBOLS AND ERROR SYNDROMES

FIELD OF INVENTION

The invention relates generally to error correction systems and, more particularly, to systems that use hardware that both encodes the data and produces associated error syndromes.

BACKGROUND OF THE INVENTION

Encoders for encoding data in accordance with a Reed-Solomon error correction code ("ECC") to produce ECC symbols are well known. A conventional encoder that produces "R" ECC symbols includes R Galois Field multipliers. The Galois Field multipliers are associated, respectively, with the j roots of the code generator polynomial, g(x). The encoder also includes feedback adders that combine the products associated with a given data symbol with the results of the encoding of the previous data symbol, and j registers that hold the sums produced by the adders. At the end of the encoding, the j registers contain the ECC symbols.

When a data symbol is supplied to the encoder the symbol is combined with the contents of a last register and the result is supplied to the Galois Field multipliers, which simultaneously multiply the results by the roots of g(x). The product produced by a first Galois Field multiplier updates the first register. The products produced by the remaining Galois Field multipliers are combined, respectively, with the contents of the remaining registers and the results are used to update these registers. The last register is thus updated with the sum of (i) the product produced by the last Galois Field multiplier and (ii) the contents of the preceding register. The updated contents of the last register are then combined with the next data symbol, and the result is fed back to the Galois Field multipliers. The remaining feedback adders add the products produced by the multipliers to the results of the encoding of the previous data symbol and supply the sums to update the registers, and so forth. As soon as the last data symbol is encoded, the ECC symbols are read from or clocked out of the R registers and concatenated with the data symbols to produce a data codeword that is transmitted or stored, as appropriate. With such an encoder the latency is the time associated with a single feedback adder, since the adders operate in parallel to produce the updated sums for the registers. Accordingly, the latency is essentially non-existent.

As part of a decoding operation a decoding system manipulates the data symbols of a data code word to produce error syndromes that are then used to locate errors in the data. A conventional error syndrome generator includes R sets of associated update adders, Galois Field multipliers and registers, with each set operating simultaneously and essentially separately to produce the associated error syndrome. Each update adder adds the product produced by the associated Galois Field multiplier to the next data symbol, and updates the associated register with the sum. Each Galois Field multiplier then multiplies the contents of the register by a root of an error syndrome generator polynomial that is associated with the ECC and supplies the product to the associated update adder. The update adder adds the product to the next data symbol, and supplies the sum to the associated register, and so forth. After the last data symbol is supplied to the syndrome generator and added to the products produced by the respective Galois Field multipliers to update the registers, the R registers contain the R error syndromes.

The Galois Field multipliers that are included in the encoder and the syndrome generator are relatively complex components. An article by Gerhard Fettweis and Martin Hassner, *A Combined Reed-Solomon Encoder And Syndrome Generator With Small Hardware Complexity*, published by IEEE in 1992 describes hardware that uses the same Galois Field multipliers for both the encoding and the syndrome generation. The combined hardware thus uses one-half the number of multipliers that are required for separate encoder and syndrome generator hardware. The article is incorporated herein by reference.

The combined hardware described in the article is depicted in FIG. 1. The hardware includes R sets of associated registers 10, Galois Field multipliers 12, update adders 14 and feedback adders 16. The R registers 10 hold updated sums produced by the R associated update adders 14. Each Galois Field multiplier 12 multiplies the contents of the associated register 10 by a root of the generator polynomial and supplies the product to the associated feedback adder 16. During encoding operations, an associated AND gate 18 passes to the adder 16 the sum produced by the previous feedback adder 16. The adder 16 then adds the propagating sum to the product and passes the result both to the associated update adder 14 and through a next AND gate 18 to the next feedback adder 16. The next feedback adder 16 adds the propagating sum to the product produced by the associated multiplier 12, and the result is supplied to the associated update adder 14 and through the next AND gate 18 to a next feedback adder, and so forth. The feedback adders 16 and associated AND gates 18 thus form a feedback path in which the adders 16 operate as a chain. During syndrome generation operations, the AND gates 18 essentially break the chain of adders by blocking the propagation of a sum from one feedback adder 16 to the next, and the R sets of associated registers 10, multipliers 12 and adders 14 operate separately to produce the R error syndromes.

With the combined hardware there is a latency in the encoding operations that corresponds to the time it takes the propagating sum to pass through the chain of R feedback adders as each symbol is encoded. If the chain of adders is long, it restricts the speed with which the data is encoded by setting a minimum time for a clock cycle, that is, a minimum time for the encoding of each symbol, since in each clock cycle the corresponding propagating sum must pass through the entire chain of R adders.

SUMMARY OF THE INVENTION

The invention is a parallel input/output combined encoding and syndrome generating system that encodes two symbols per clock cycle, and thereafter, produces two redundancy symbols per clock cycle. The system thus produces the R redundancy symbols and the R error syndromes in one-half the time of the conventional Fettweis-Hassner hardware.

More specifically, for an n-symbol code word with 2k information symbols $c_{n-1}$, to $c_{n-2k}$, the symbols $c_{n-1}$, $c_{n-3}$, $c_{n-5}$ . . . are supplied, in turn, to a first input line while the symbols $c_{n-2}$, $c_{n-4}$, $c_{n-6}$, . . . are supplied, in turn, to a second input line. In a first clock cycle, the symbol $c_{n-1}$ is combined with the contents of the R registers and multiplied by the roots of the generator polynomial. The respective products then are combined with the paired symbol $c_{n-2}$ and the resulting sums are multiplied also by the roots of the generator polynomial. These products are then summed in the chain of R adders and the registers are appropriately updated with the results of the encoding of the pair of symbols. Accordingly, a sum is propagated along the chain of R adders once to encode the two symbols.

During the next clock cycle, the next pair of information symbols are encoded, with $c_{n-3}$ supplied to the first input line and $c_{n-4}$ supplied to the second input line, and so forth. During the $k^{th}$ clock cycle, when the last of the pairs of information symbols are being encoded, the system produces the first two redundancy symbols. More specifically, the first redundancy symbol is the $k^{th}$ update value for the last register $r_{R-1}$, which is produced by the chain of R adders. The system then manipulates the update value, as discussed in more detail below, to produce the second redundancy symbol in the same clock cycle. During the $k+1^{st}$ clock cycle, the pair of redundancy symbols are fed back to the two input lines and encoded, as discussed above, to produce the next pair of redundancy symbols, and so forth. The system thus produces the R redundancy symbols in $$\frac{2k+R}{2} = \frac{n}{2}$$

clock cycles.

For decoding, the chain of R feedback adders is broken, and each set of adders and multipliers operates separately to update the associated register with the results of the encoding of pairs of code word symbols. The system thus produces the R error syndromes in $$\frac{n}{2}$$

clock cycles.

The gate-count of the parallel input/output system may be reduced, essentially by further manipulating the propagating sum, as discussed in more detail below.

BRIEF DESCRIPTION OF THE DRAWINGS

The invention description below refers to the accompanying drawings, of which.

DETAILED DESCRIPTION OF AN ILLUSTRATIVE EMBODIMENT

We discuss below the theory of the Fetweiss-Hassner systems of FIGS. 1 and 2 and then discuss the theory behind and the associated hardware of the parallel input/output system.

1. THEORY OF THE FETWEISS-HASSNER SYSTEMS OF FIGS. 1 AND 2

Figure 1:
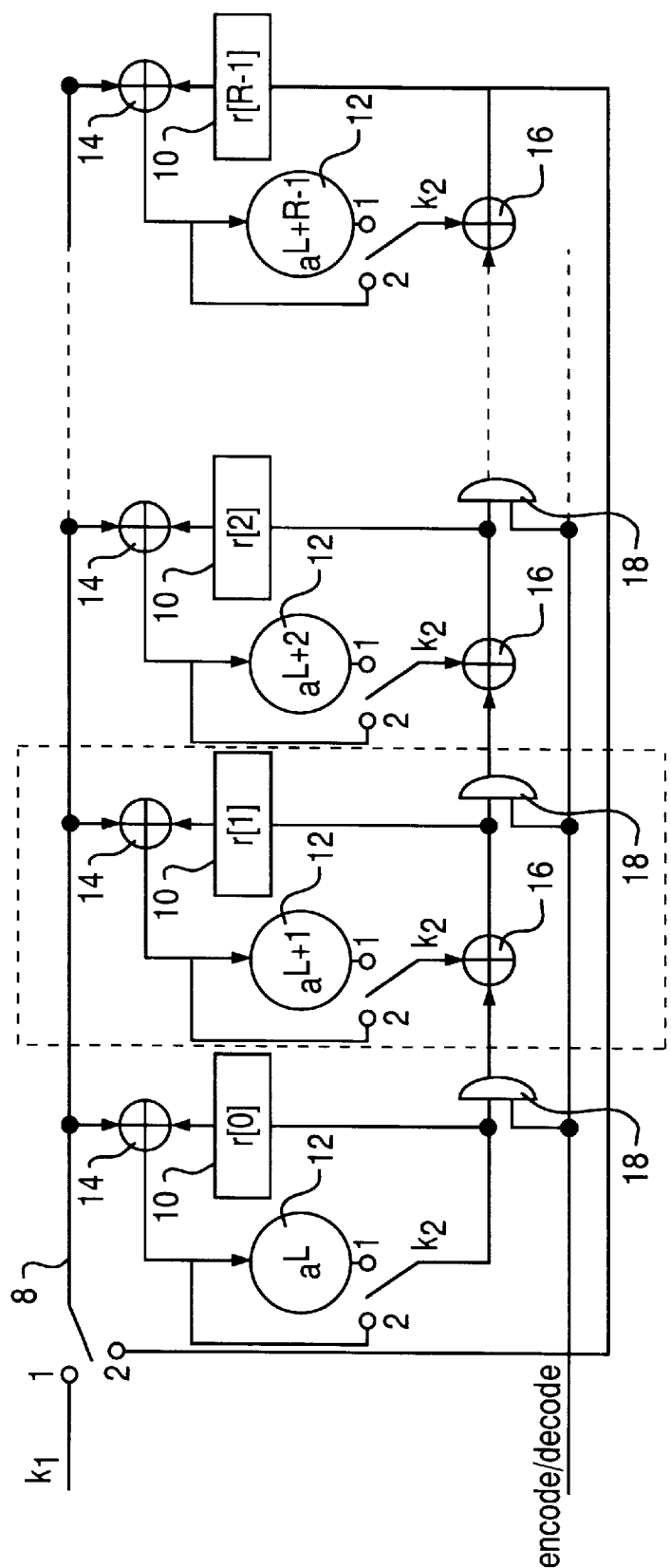
FIGS. 1 and 2 depict in diagram form the prior Fettweis-Hassner systems.

In order to better understand the parallel input/output system, we discuss first the theory of the conventional Fettweis-Hassner system of FIG. 1, which produces in 2k+R clock cycles R error correction code (ECC) redundancy symbols or R error syndromes based on a Reed-Solomon ECC over $GF(2^m)$, with a generator polynomial $$g(x)=(x-\alpha^L)(x-\alpha^{L+1}) \ldots (x-\alpha^{L+R-1}).$$

Initially, at time j=0, the registers 10 are set to all zeros, that is, $r_{i,0}=0$, for $1 \leq i \leq R-1$, where $r_{i,j}$ represents the contents of the $i^{th}$ register $r_i$ at the $j^{th}$ clock cycle. For times $j \geq 1$, the registers 10 are updated during encoding operations as:

$$r_{i,j}=r_{i-1,j}+\alpha^{L+i}(c_{n-j}+r_{i,j-1})$$

where $c_j$ is the $j^{th}$ codeword symbol, that is, the symbol which is supplied to the update adders 14 over input line 8 during the $j^{th}$ clock cycle. The chain of feedback adders begins at the first stage of the system, and thus, by definition, $r_{-1,0}=0$ for all j.

At time j=1, the registers contain:

$$r_{0,1}=0+\alpha^L(c_{n-1}+0)$$

$$r_{1,1}=r_{0,1}+\alpha^{L+1}(c_{n-1}+0)=\alpha^L(c_{n-1})+\alpha^{L+1}(c_{n-1})$$

$$r_{2,1}=r_{1,1}+\alpha^{L+2}(c_{n-1}+0)=\alpha^L(c_{n-1})+\alpha^{L+1}(c_{n-1})+\alpha^{L+2}(c_{n-1}), \ldots$$

$$r_{i,1} = \sum_{k=0}^{i} \alpha^{L+k} c_{n-1}.$$

At time j=2, the registers contain:

$$r_{0,2} = 0 + \alpha^L(r_{0,1} + c_{n-2})$$

$$r_{1,2} = r_{0,2} + \alpha^{L+1}(r_{1,1} + c_{n-2}) = \alpha^L(r_{0,1} + c_{n-2}) + \alpha^{L+1}(r_{1,1} + c_{n-2})$$

$$r_{2,2} = r_{1,2} + \alpha^{L+2}(r_{2,1} + c_{n-2})$$

$$= \alpha^L(r_{0,1} + c_{n-2}) + \alpha^{L+1}(r_{1,1} + c_{n-2}) + \alpha^{L+2}(r_{2,1} + c_{n-2})$$

. . .

$$r_{i,2} = \sum_{k=0}^{i} \alpha^{L+k} (r_k, 1 + c_{n-2})$$

The general update expression for $1<j \leq n-R$ is thus $r_{i,j}=$ $$r_{i,j} = \sum_{k=0}^{i} \alpha^{L+k} (r_{k,j-1} + c_{n-j}).$$

After all 2k information symbols are encoded, the register $r_{R-1}$ contains the first redundancy symbol, $c_{R-1}$. The switch $k_1$ is moved to position 2, and the redundancy symbol is fed back for the further encoding that produces $c_{R-2}$ and so forth. Accordingly, the update expression holds for $j \geq n-(R+1)$ and i>0.

Figure 2:
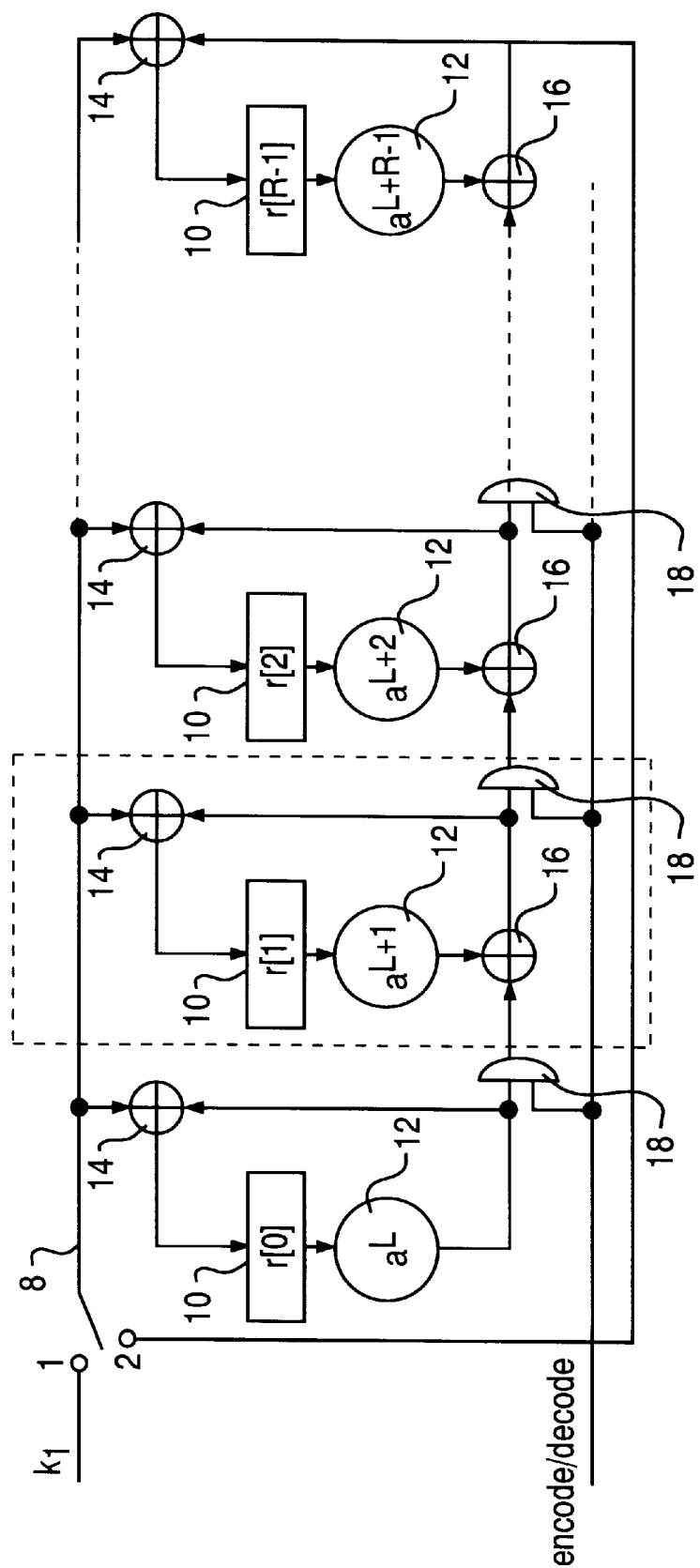

The update expression for the equivalent circuit of FIG. 2 has two updated values, namely, the value, $y_{i,j}$, that gets propagated to the next stage, and the value, $r^*_{i,j}$, that updates the registers:

$$y_{i,j}=y_{i-1,j}+\alpha^{L+i}r^*_{i,j-1} \text{ for } 1 \leq i \leq R-1$$

where $y_{-1,j}=0$ for all $j$ and $$r^*_{i,j}=y_{i,j}+c_{n-j}.$$

As discussed above, the registers are initially set to all zeros, that is, $r^*_{i,0}=0$, for all $i$'s.

Accordingly, at time $j=1$, $$y_{i,1}=0+\alpha^{L+i}0=0 \text{ for } 1 \leq i \leq R-1$$

and $$r^*_{i,1}=0+c_{n-1}$$

For $j=2$, the update expressions are:

$$y_{i,2} = y_{i-1,2} + \alpha^{L+i} r^*_{i,1} = y_{i-1,2} + \alpha^{L+i} c_{n-1} = \sum_{k=0}^{i} \alpha^{L+k} c_{n-1}$$

with $$r^*_{i,2} = y_{i,2} + c_{n-2} = \sum_{k=0}^{i} \alpha^{L+k} c_{n-1} + c_{n-2}.$$

The general update expression for the value that is propagated through the chain of feedback adders is thus:

$$y_{i,j+1} = \sum_{k=0}^{i} \alpha^{L+k}(y_{k,j} + c_{n-j}) \text{ for } 1 < j \leq n - R.$$

After the encoding of the information symbols, the last register contains the first redundancy symbol $c_{R-1}$. The switch $k_1$ is then moved to position 2, and the redundancy symbol fed back for the further encoding that produces the remaining redundancy symbols. The update expression thus holds for all $j$ with $i>1$, and the propagated value $y_{i,j+1}$ is equal to the propagated value $r_{i,j}$ of FIG. 1. The system of FIG. 2 thus produces the R redundancy symbols in $n+1$ clock cycles, while the system of FIG. 1 produces them in $n$ clock cycles.

For syndrome generation, the chain of feedback adders is broken by disabling the AND gates 18 and each stage separately calculates the syndromes:

$$S_i = \sum_{j=0}^{n-1} \alpha^{(L+i)j} c_j$$

The update expression for the registers of FIG. 1 for syndrome generation is:

$$r_{i,j} = \alpha^{L+i}(r_{i,j-1} + c_{n-j}) = \sum_{k=1}^{j} \alpha^{(L+i)(j-k+1)} c_{n-k}$$

If the system operates in the same manner as all n codeword symbols are supplied to the system, the registers at the $n^{th}$ clock cycle contain:

$$r_{i,n} = \sum_{k=1}^{n} \alpha^{(L+i)(n-k+1)} c_{n-k} = \sum_{t=0}^{n-1} \alpha^{(L+i)(t+1)} c_t = \alpha^{L+i} S_i$$

To avoid the last multiplication by $\alpha^{L+i}$, the system of FIG. 1 includes bypass switches $k_2$, which are moved to position 2 when the $n_{th}$ codeword symbol is supplied to the system. The last codeword symbol is then combined directly with the contents of the registers, to update the registers to the syndrome values.

The system of FIG. 2 does not require the bypass switches, since the registers are updated directly with the last codeword symbol during the $n_{th}$ clock cycle. More specifically, the update expression for the registers of FIG. 2 is:

$$r^*_{i,j} = c_{n-j} + \alpha^{L+i} r^*_{i,j-1} = \sum_{k=0}^{j} \alpha^{(L+i)j-k} c_{n-k} \text{ for } j \leq n$$

and the registers thus contain the syndromes after the $n^{th}$ clock cycle.

As discussed below with reference to FIGS. 3–10, we have improved the Fetweiss-Hassner systems of FIGS. 1 and 2, such that the improved systems encode or decode two symbols in each clock cycle. These improved systems thus produce the error syndromes and the ECC redundancy symbols in one-half the time of the prior systems.

2. THE THEORY OF THE PARALLEL INPUT/OUTPUT SYSTEMS OF FIGS. 3–5

The update expressions for the system of FIG. 1 for $j=1$, 2...$n-1$ are:

$$r_{0,j}=\alpha^L(c_j+r_{0,j-1})$$

and $$r_{i,j}=r_{i-1,j}+\alpha^{L+i}(c_{n-j}+r_{i,j-1}) \text{ for } i=1,2, \ldots R-1.$$

Accordingly, for a codeword with an even number, $2k$, of information symbols the registers contain:

$$r_{0,2b-1}=\alpha^L(c_{n-(2b-1)}+r_{0,2b-2})$$

$$r_{0,2b}=\alpha^L(c_{n-2b}+r_{0,2b-1})=\alpha^L(c_{n-2b}+\alpha^L(c_{n-(2b-1)}+r_{0,2b-2}))$$

and $$r_{i,2b-1} = r_{i-1,2b-1} + \alpha^{L+i}(c_{n-(2b-1)} + r_{i,2b-2})$$

$$r_{i,2b} = r_{i-1,2b} + \alpha^{L+i}(c_{n-2b} + r_{i,2b-1})$$

$$= r_{i-1,2b} + \alpha^{L+i}(c_{n-2b} + r_{i-1,2b-1} + \alpha^{L+i}(c_{n-(2b-1)} + r_{i,2b-2}))$$

for $b=1, 2, \ldots, k$.

We now define a recurrence relation $T_{i,j}$ and an auxiliary relation $\tilde{T}_j$:

$$T_{0,j}=\alpha^L(c_{n-2j}+\alpha^L(c_{n-(2j-1)}+T_{0,j-1}))$$

$$\tilde{T}_{0,j}=\alpha^L(c_{n-(2j-1)}+T_{0,j-1})$$

and $$T_{i,j}=T_{i-1,j}+\alpha^{L+i}(c_{n-2j}+\tilde{T}_{i-1,j}+\alpha^{L+i}(c_{n-(2j-1)}+T_{i,j-1}))$$

$$\tilde{T}_{i,j}=\tilde{T}_{i-1,j}+\alpha^{L+i}(c_{n-(2j-1)}+T_{i,j-1})$$

For each time period $j$, that is, each clock cycle, the two values $T_{i,j}$ and $\tilde{T}_{i,j}$ can be determined based on the value $T_{i,j-1}$ calculated in the previous time period and two input symbols $c_{n-(2j-1)}$ and $c_{n-2j}$. The recurrence relation $T_{i,j}$ provides the updated value for $r_{i,2j}$ for $1 \leq j \leq k$. After k clock cycles, $T_{R-1,k}=r_{R-1,2k}=c_{R-1}$, that is, $T_{R-1,k}$ is equal to the first ECC redundancy symbol.

As discussed above, the redundancy symbol is further encoded to produce the remaining ECC redundancy symbols. In order to carry the recurrence relation T forward, however, two redundancy symbols, namely, $c_{R-1}=r_{R-1,2k}$ and $c_{R-2}=r_{R-1,2k+1}$ must be calculated in the $k^{th}$ clock cycle.

Based on the update expression for $r_{i,j}$:

$$r_{i,2k+1} = r_{i-1,2k+1} + \alpha^{L+i}(c_{R-1} + r_{i,2k})$$

$$= \sum_{b=0}^{i} \alpha^{L+b}(r_{b,2k} + c_{n-2k})$$

Accordingly, $$r_{R-1,2k+1} = \sum_{i=0}^{R-1} \alpha^{L+i}(r_{i,2k} + c_{n-2k}) = \sum_{i=0}^{R-1} \alpha^{L+i}(r_{i,2k} + c_{R-1})$$

$$= \sum_{i=0}^{R-1} \alpha^{L+i} r_{i,2k} + \sum_{i=0}^{R-1} \alpha^{L+i} c_{R-1} = \sum_{i=0}^{R-1} \alpha^{L+i} r_{i,2k} + c_{R-1} \sum_{i=0}^{R-1} \alpha^{L+i}$$

The summation included in the last term of the expression is a constant, and thus, the last term of the expression can determined by multiplying the redundancy symbol $c_{R-1}$ by the constant $$\sigma = \sum_{i=0}^{R-1} \alpha^{L+i}, \quad \text{and} \quad c_{R-2} = \sum_{i=0}^{R-1} \alpha^{L+i} r_{i,2k} + \sigma c_{R-1}$$

More generally, $$c_{R-2b} = r_{R-1,2k+b} = \sum_{i=0}^{R-1} \alpha^{L+j} r_{i,2(k+b-1)} + \sigma c_{R-(2b-1)} \text{ for } b \geq 1.$$

To produce the two redundancy symbols $c_{R-1}$ and $c_{R-2}$, or more generally, $c_{R-(2b+1)}$ and $c_{R-(2b+2)}$, in the same clock cycle, and thus, carry the recurrence relation $T_j$ forward, we define a recurrence relation $V_j$ as:

$$V_{i,j} = V_{i-1,j} + \alpha^{L+i} T_{i,k+j} \text{ for } i=0, 1, \ldots R-2$$

where $V_{-1,j}=0$ for all $j$ and thus $$V_{i,j} = \sum_{b=0}^{i} \alpha^{L+b} T_{b,k+j}$$

For $i=R-1$, $V_j$ is:

$$V_{R-1,j} = V_{R-2,j} + \sigma T_{R-1,k+j}$$

$$= \sum_{i=0}^{R-2} \alpha^{L+i} T_{i,k+j} + \sigma T_{R-1,k+j}$$

$$= \sum_{i=0}^{R-2} \alpha^{L+i} r_{i,2(k+j)} + \sigma c_{2(k+j)} = c_{R-2(j+1)}$$

Note that $V_j$ does not depend on $V_{j-1}$ and there is thus no need to store the $V_j$'s for the next clock cycle.

Figure 3:
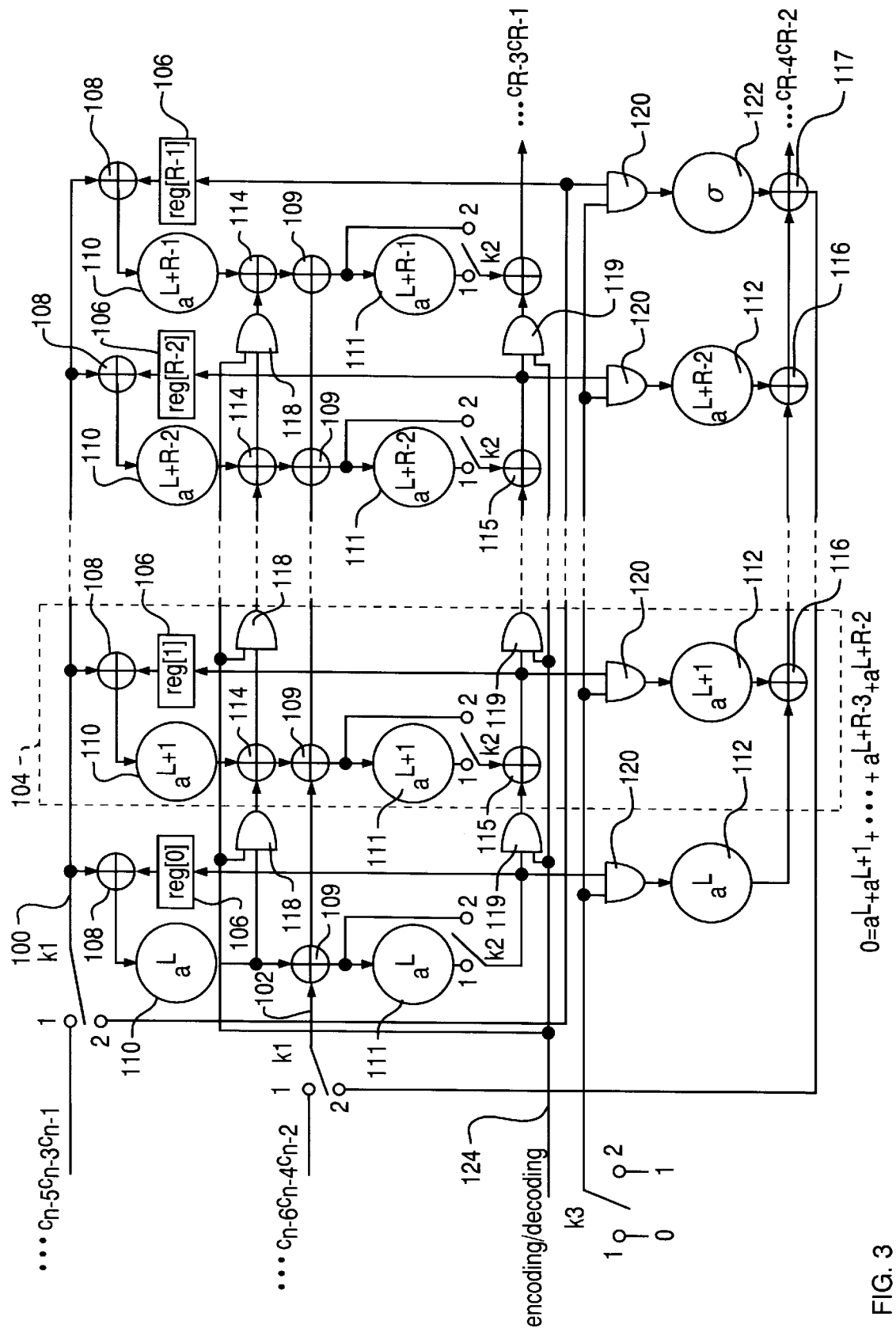
FIG. 3 depicts in diagram form a parallel input/output system for encoding and decoding codewords with even numbers of symbols.

Referring now to FIG. 3, we use a combination of the recurrence relations $T_j$ and $V_j$ to encode two symbols per clock cycle and then produce two redundancy symbols per clock cycle. As depicted in the drawing, a parallel input/output system includes two input lines 100 and 102 and R stages 104 that each include a register 106, a pair of update adders 108 and 109, a plurality of Galois Field multipliers 110–112, a plurality of feedback adders 114–116 and a plurality of AND gates 118–120. The AND gates 118–120 connect the feedback adders 114–116 into a plurality of adder chains that, as discussed below, operate in parallel. During encoding operations, the switches $k_1$, $k_2$ and $k_3$ are in position 1 as the codeword information symbols are supplied to the system. The switches $k_1$ and $k_3$ are then moved to position 2, while the system produces the redundancy symbols. The bypass switches $k_2$ remain in position 1 for the entire encoding operation.

The information symbols $c_{n-1}, c_{n-3}, \ldots, c_{n-(2k-1)}$ are supplied, in turn, to input line 100 and information symbols $c_{n-2}, c_{n-4}, \ldots, C_{n-2k}$ are supplied, in turn, to the input line 102. In a first clock cycle, the pair of information symbols $c_{n-1}$ and $C_{n-2}$ are supplied in parallel to the system over the lines 100 and 102. The information symbol $c_{n-1}$ is applied to the update adders 108, which each add the symbol to the contents of the associated register 106. The associated sum is then multiplied by a root of the generator polynomial in the associated Galois Field multiplier 110 and the product is supplied to the associated feedback adder 114.

The feedback adder 114 propagates the sum to a next stage through the associated AND gate 118 and also supplies the sum to the associated update adder 109. The update adder 109 adds the sum to the information symbol $c_{n-2}$ that is supplied to the system on line 102, and supplies the result to the associated Galois Field multiplier 111. The Galois Field multiplier 111 multiplies the sum by the associated root of the generator polynomial, and supplies the product to the chain of adders 115. The feedback adder 115 combines the product into a second propagating sum and supplies the propagating sum to the associated register 106. The adder 115 also propagates the sum to a next stage through the associated AND gate 119. At the same time, the sum is supplied to the associated AND gate 120, which is currently disabled through switch $k_3$.

The next stages similarly encode the pair of information symbols $c_{n-1}$ and $C_{n-2}$ and propagate the associated sums in parallel along the chains of adders 114 and 115 through AND gates 118 and 119. The adders 115 produce $T_j$ and the adders 114 produce $\tilde{T}_j$. Accordingly, when the propagating sums reach the end of the respective chains of R feedback adders, the two information symbols have been encoded. The pair of symbols is thus encoded in the same clock cycle.

In a next and succeeding clock cycles, successive pairs of information symbols are supplied to the system and encoded through the parallel chains of R adders 114 and 115, such that all 2k information symbols are encoded in k clock cycles.

When the last pair of information symbols, $c_{n-(k+1)}$ and $c_{n-k}$, is supplied to the system, the switch $k_3$ is moved to position 2, and the AND gates 120 are enabled. The sum through feedback adders 115 is then supplied to the Galois Field multipliers 112, and an associated sum propagates through the feedback adders 116. In the last stage 104, the sum propagating through the feedback adders 115, which is $T_k$, or $c_{R-1}$, is multiplied in Galois Field multiplier 122 by the constant $$\sigma = \sum_{i=0}^{R-1} \alpha^{L+i},$$

and the result is added, in feedback adder 117, to the sum that is propagating through the feedback adders 116. The sum produced by the feedback adder 117 is $V_{R-1}=c_{R-2}$, that is, the second redundancy symbol.

The results produced by the last stage 104 are read out of the system as the first and second redundancy symbols. The two redundancy symbols are also fed back to the input lines 100 and 102 through switches $k_1$, which have moved to position 2.

In the next clock cycle, the system encodes the two redundancy symbols, to produce a next pair of redundancy symbols in the feedback adders 115 and 117 of the last stage 104. In succeeding clock cycles, the pairs of redundancy symbols are fed back and encoded to produce the next pairs of redundancy symbols until all R symbols are produced. Accordingly, the system operates for another $$\frac{R}{2}$$

clock cycles after the information symbols are encoded to produce the R redundancy symbols. The system thus produces the R redundancy symbols in a total of $$\frac{n}{2}$$

clock cycles, instead of the n clock cycles required by the system of FIG. 1.

When the system of FIG. 3 is used to decode a codeword and produce the error syndromes, the switch $k_3$ is in position 1 and the AND gates 120 are disabled. Further, the AND gates 118 and 119 are disabled through a deasserted line 124. When the pairs of codeword symbols are supplied to update adders 108 and 109 over lines 100 and 102, the sum produced by the update adder 108 in a given stage 104 is multiplied by a root of the generator polynomial in the associated Galois Field multiplier 110 and the product is combined with the second codeword symbol in the associated update adder 109. The resulting sum is multiplied by the root of the generator polynomial in Galois Field multiplier 111 and the product is supplied to update the associated register 106. When the last pair of codeword symbols are supplied to the system, the bypass switches $k_2$ are moved to position 2, and the sums produced by the respective update adders 109 are supplied directly to update the registers 106. At the end of $$\frac{n}{2}$$

clock cycles, the registers 106 contain the syndromes $S_0$, $S_1$ . . . $S_{R-1}$. The system thus produces the syndromes in one-half the time required by of the system of FIG. 1.

As is understood by those skilled in the art, the number of Galois Field multipliers in the system of FIG. 3 can be reduced by time sharing the multipliers. For example, each stage except the last stage may be modified to include a single Galois Field multiplier 110 that is used repeatedly, with appropriate switching, to produce the various sums that propagate through the chains of feedback adders 114, 115, and 116. The last stage requires at least the Galois Field multipliers 110 and 122, to calculate both $T_j$ and $V_j$.

Figure 4:
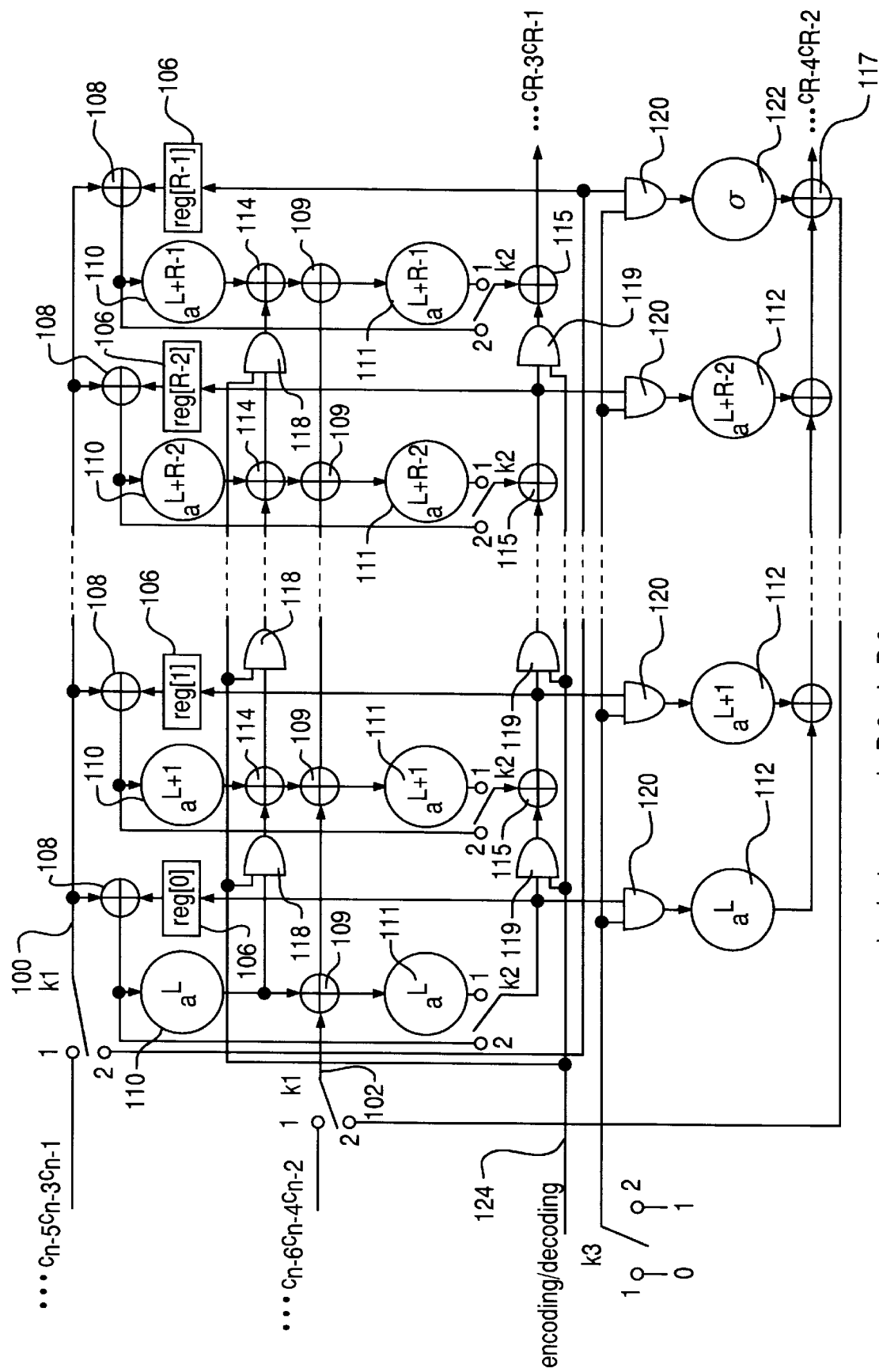
FIG. 4 depicts in diagram form a parallel input/output system for encoding and decoding codewords with odd numbers of symbols.

FIG. 4 depicts the parallel input/output system for encoding and decoding codewords that contain odd numbers of symbols. The system of FIG. 4 ties the bypass switches $k_2$ to both of the Galois Field multipliers 110 and 111, instead of just to the Galois Field multipliers 111. During decoding, the bypass switches $k_2$ are moved to position 2 before the last code word symbol is supplied to the system over line 100. The last symbol then bypasses both Galois Field multipliers, such that the symbol directly updates the registers 106. This is in contrast to the system of FIG. 3, in which the last symbol is supplied to the system over input line 102, and thus, only the Galois Field multiplier 111 must be bypassed.

As is understood by those skilled in the art, the systems of FIGS. 3 and 4 may be combined, with the appropriate bypass switches selectively activated to control the bypassing of the Galois Field multipliers 111 and/or 110 for codeword symbols with even or odd numbers of symbols. Further, the switch $k_3$ may be any mechanism that selectively enables and disables the AND gates 120.

Figure 5:
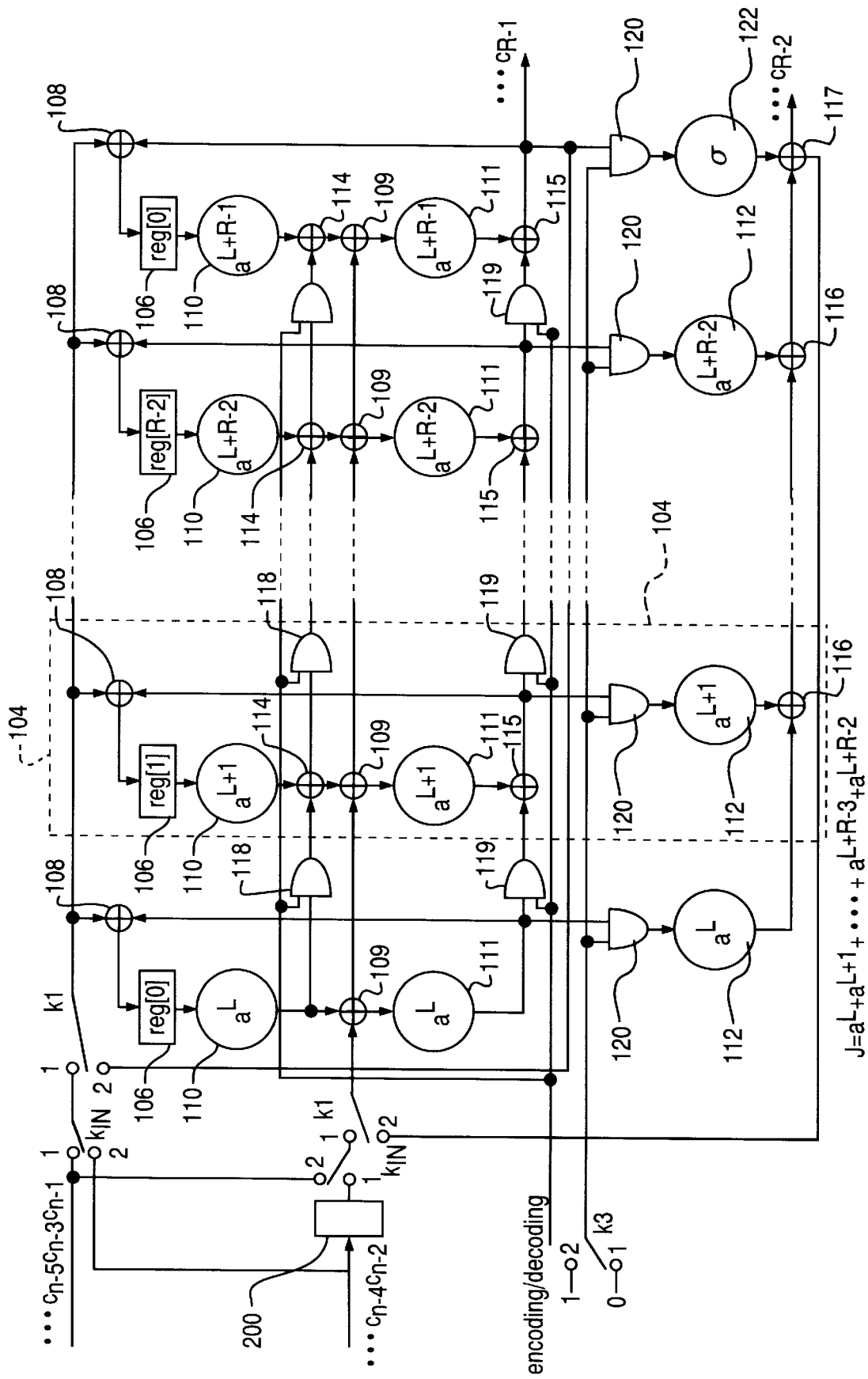
FIG. 5 depicts a system that is equivalent to the system of FIG. 3.

FIG. 5 depicts an equivalent parallel input/output system that does not require the bypass switches of FIGS. 3 and 4. As information symbols are supplied to the system for encoding, the switches $k_1$ and $k_3$ are each in position 1, and switches $k_{IN}$ in the input lines 100 and 102 are also in position 1. The information symbols are supplied in pairs to the input lines 100 and 102 as discussed above with reference to FIG. 3. The update adders 108 add the symbol on the line 100 to the sums propagating through the feedback adders 115 and supply the results to update the respective registers 106, while the paired codeword symbol on line 102 is held in a delay 200.

In the next clock cycle, the symbol from the delay 200 is supplied to the update adders 109, which each add the symbol to the sum that propagates through the chain of feedback adders 114. The update adders 109 then supply the sum to the associated Galois Field multipliers 111. Each Galois Field multiplier 111 multiplies the respective sum by the associated root of the generator polynomial and supplies the product to the associated feedback adder 115. The feedback adder 115 combines the product into the associated propagating sum and supplies the sum both to the update adders 108 and through the associated AND gates 119 to the next stage 104.

At the same time, the next pair of information symbols is supplied over the input lines 100 and 102. The symbol on line 100 is combined in update adder 108 with the sum that is propagating through the chain of feedback adders 115, and the results update the registers 106. The symbol on line 102 is held in the delay 200.

After the last pair of information symbols is supplied to the system, the switch $k_3$ is moved to position 2 and the AND gates 120 are enabled. The sum propagating through the chain of feedback adders 115 is then supplied to Galois Field multipliers 112, and the resulting product is included in the sum that propagates through the chain of feedback adders 116. At the end k+1 clock cycles, the system produces the first pair of redundancy symbols $c_{R-1}$ and $c_{R-2}$ in the feedback adders 115 and the 117 in the last stage 104.

The switches $k_1$ are then moved to position 2, so that the first redundancy symbol, which is produced by the feedback adder 115, is fed back to the input line 100 and included in the updating of the registers 106. Also, the second redundancy symbol, which is produced by the feedback adder 117, is supplied directly to the input line 102, with the delay 200 bypassed. The system then encodes successive pairs of redundancy symbols in succeeding clock cycles, to produce the remaining pairs of redundancy symbols.

During the decoding operations, the delay 200 is bypassed with the switches $k_{IN}$ in position 2 and the switches $k_1$ in position 1. The codeword symbols on line 100 are then supplied to the update adders 109, and the codeword symbols on line 102 are at the same time supplied to the update adders 108. Further, the switch $k_3$ is in position 1, to disable the AND gates 120, and line 124 is deasserted to disable the AND gates 118 and 119, such that each stage 104 operates separately to produce the syndromes $S_i$. The bypass switches of FIGS. 3 and 4 are not required in this configuration of the system, since the last codeword symbol directly updates the registers 106 through update adders 108. There is, however, a tradeoff with the inclusion of the delay 200 for the encoding operations.

3. A PARALLEL INPUT/SINGLE OUTPUT SYSTEM OF FIG. 6

Figure 6:
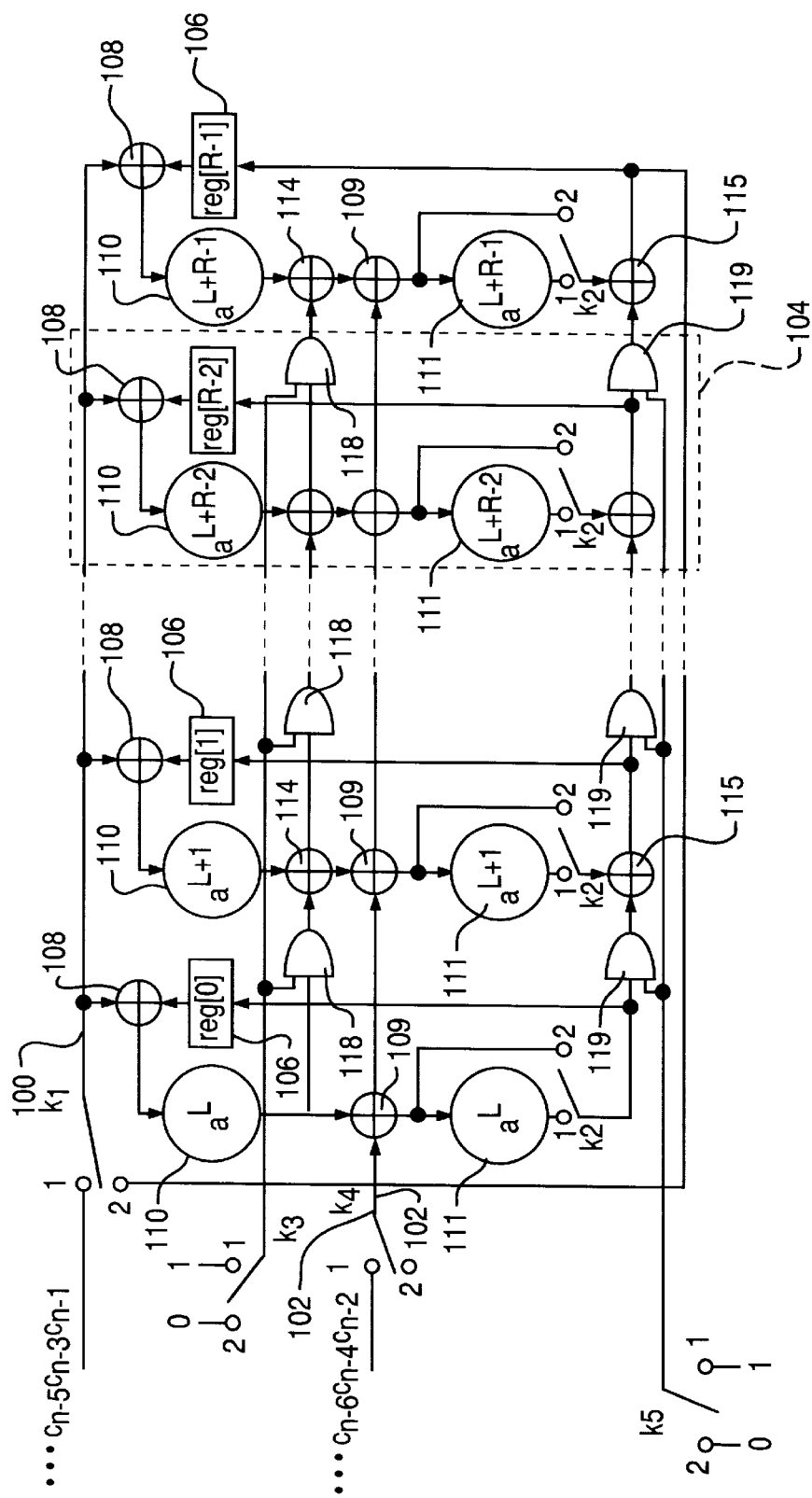
FIG. 6 depicts in diagram form a parallel input/single output system.

Referring now to FIG. 6, a parallel input/single output system may be used to interleave information symbols by supplying the symbols for encoding over the two input lines 100 and 102 in the desired interleaved order. The system includes switches $k_1$, $k_2$, $k_3$ and $k_4$ that are each in position 1 while the information symbols are supplied over lines 100 and 102, and a switch $k_5$ that remains in position 1 throughout the encoding operations. The system then operates in the same manner as the system of FIG. 3, to encode pairs of information symbols in each clock cycle.

After the last pair of last information symbols is supplied to the system, the switch $k_1$ is moved to position 2, and the redundancy symbol $T_k = c_{R-1}$ is fed back to the input line 100. The switches $k_2$, $k_3$ and $k_4$ are each moved to position 2, so that the system continues encoding in the conventional manner using the registers 106, the update adders 108, the Galois Field multipliers 110 and the chain of feedback adders 115, to produce the remaining R-1 redundancy symbols in the next R-1 clock cycles. The adders 114 and 109 and also included, to pass the products produced by the Galois Field multipliers to the chain of feedback adders 115.

4. A PARALLEL INPUT/OUTPUT SYSTEM WITH FEWER XOR GATES

Figure 7:
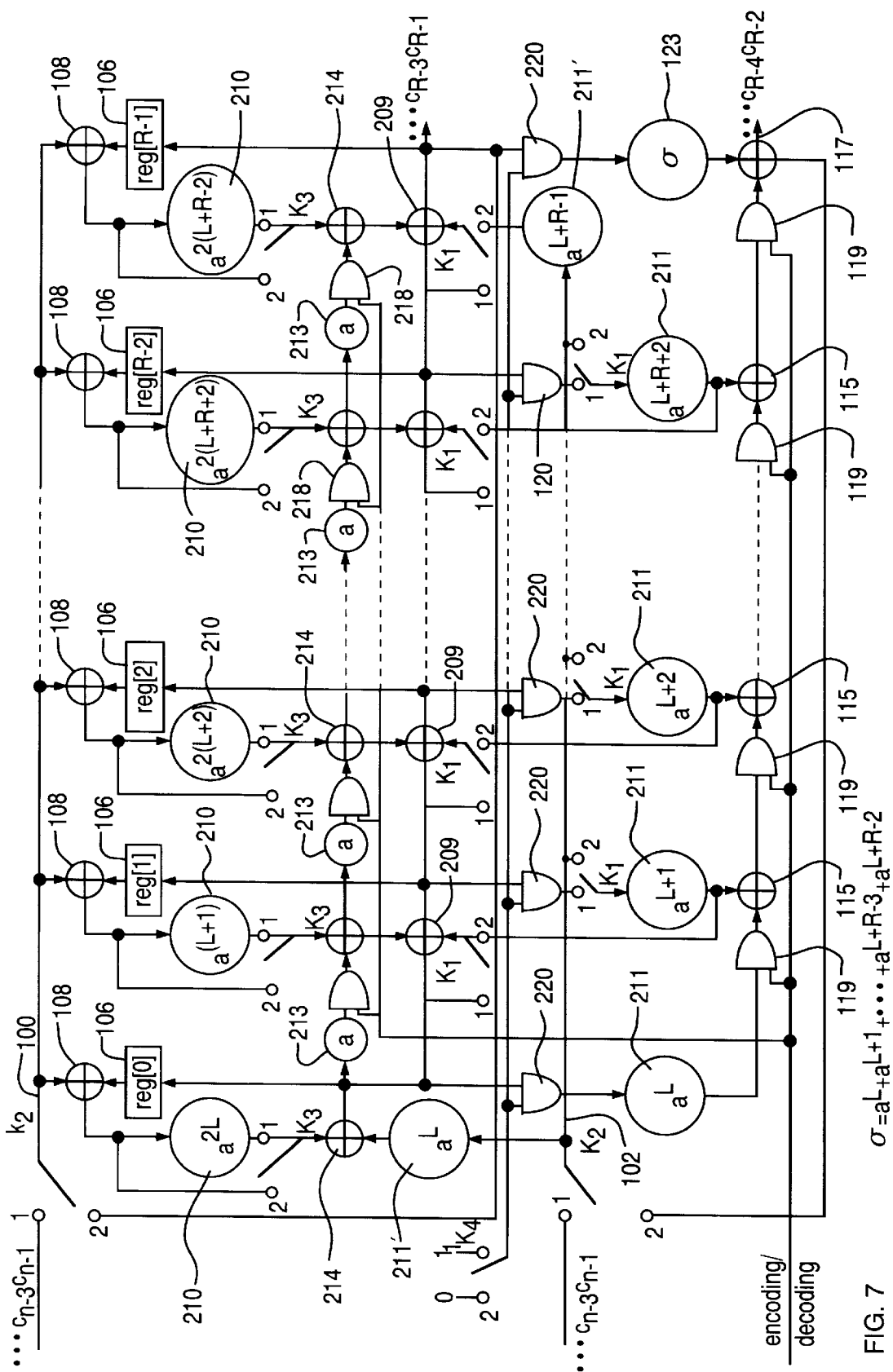
FIG. 7 depicts the system of FIG. 3 or 4 with fewer XOR gates.

Referring now to FIG. 7, the registers 106 are updated as $$r_{ij} = \sum_{k=0}^{i} \alpha^{L+k}(r_{k,j-1} + c_{n-j}) \text{ for } j \geq 1$$

where $c_{R-b} = r_{R-1,n-(R+b)}$ for $1 \leq b \leq R$. The registers at $j \geq 1$ are thus in the state $$r_j = \begin{bmatrix} r_{0j} \\ r_{1j} \\ \ldots \\ r_{ij} \end{bmatrix} = \begin{bmatrix} \alpha^L r_{0,j-1} + \alpha^L c_{n-j} \\ \alpha^{L+1} r_{1,j-1} + \alpha^L r_{0,j-1} + (\alpha^{L+1} + \alpha^L) c_{n-1} \\ \ldots \\ \alpha^{L+i} r_{ij-1} + \alpha^{L+i-1} r_{i-1,j-1} + \ldots + (\alpha^{L+i} + \alpha^{L+i-1} \ldots \alpha^L) c_{n-j} \end{bmatrix}$$

The state equation in matrix form is then:

$$r_j = A\alpha^L r_{j-1} + B\alpha^L c_{n-j}$$

where $$A = \begin{bmatrix} 1 & 0 & 0 & \ldots & 0 & 0 \\ 1 & \alpha & 0 & \ldots & 0 & 0 \\ 1 & \alpha & \alpha^2 & \ldots & 0 & \\ \vdots & & & \ddots & & \vdots \\ 1 & \alpha & \alpha^2 & \ldots & \alpha^{R-2} & 0 \\ 1 & \alpha & \alpha^2 & \ldots & \alpha^{R-2} & \alpha^{R-1} \end{bmatrix}$$

$$B = \begin{bmatrix} 1 \\ 1+\alpha \\ 1+\alpha+\alpha^2 \\ \vdots \\ 1+\alpha+\ldots+\alpha^{R-2} \\ 1+\alpha+\ldots+\alpha^{R-2}+\alpha^{R-1} \end{bmatrix}.$$

The state of the registers at time 2j+2 is thus:

$$r_{2(j+1)} = A\alpha^L r_{2j+1} + B\alpha^L c_{n-2(j+1)}$$
$$= A\alpha^L (r2j + B\alpha^L c_{n-(2j+1)}) + B\alpha^L c_{n-2(j+1)}$$
$$= A^2 \alpha^{2L} r_{2j} + AB\alpha^{2L} c_{n-(2j+1)} + B\alpha^L c_{n-2(j+1)}$$

If we let L=0, and R=3, the matrices $A^2$ and AB are:

$$A^2 = \begin{bmatrix} 1 & 0 & 0 \\ 1 & \alpha & 0 \\ 1 & \alpha & \alpha^2 \end{bmatrix} \begin{bmatrix} 1 & 0 & 0 \\ 1 & \alpha & 0 \\ 1 & \alpha & \alpha^2 \end{bmatrix}$$

$$= \begin{bmatrix} 1 & 0 & 0 \\ 1+\alpha & \alpha^2 & 0 \\ 1+\alpha+\alpha^2 & \alpha^2+\alpha^3 & \alpha^4 \end{bmatrix}$$

and $$AB = \begin{bmatrix} 1 & 0 & 0 \\ 1 & \alpha & 0 \\ 1 & \alpha & \alpha^2 \end{bmatrix} \begin{pmatrix} 1 \\ 1+\alpha \\ 1+\alpha+\alpha^2 \end{pmatrix}$$

$$= \begin{pmatrix} 1 \\ 1+\alpha+\alpha^2 \\ 1+\alpha+\alpha^3+\alpha^4 \end{pmatrix}$$

and $$r_{0,2(j+1)} = r_{0,2j} + c_{n-(2j+1)} + c_{n-2(j+1)}$$

$$r_{1,2(j+1)} = (1+\alpha)r_{0,2j} + \alpha^2 r_{1,2j} + (1+\alpha+\alpha^2)c_{n-(2j-1)} + (1+\alpha)c_{n-2(j+1)}$$
$$= (1+\alpha)[r_{0,2j} + c_{n-(2j+1)} + c_{n-2(j+1)}] + \alpha^2(r_{1,2j} + c_{n-(2j+1)})$$
$$= (1+\alpha)r_{0,2(j+1)} + \alpha^2(r_{1,2j} + c_{n-(2j+1)})$$

and $$r_{2,2((j+1)} = (1+\alpha+\alpha^2)r_{0,2j} + (\alpha^2+\alpha^3)r_{1,2j} + \alpha^4 r_{2,2j} + (1+\alpha+\alpha^3+\alpha^4)c_{n-(2j-1)} + (1+\alpha+\alpha^2)c_{n-2(j+1)}$$
$$= \alpha(r_{0,2j} + c_{n-(2j+1)} + c_{n-(2j+1)}) + 1 + \alpha[(1+\alpha)r_{0,2j} + \alpha^2 r_{1,2j} + (1+\alpha+\alpha^2)c_{n-(2j+1)} + (1+\alpha)c_{n-2(j+1)}] + \alpha^4(r_{2,2j} + c_{n-(2j+1)})$$

where the middle term is:

$$=1+\alpha[\{(1+\alpha)r_{0,2j}+(1+\alpha)c_{n-2j+1}+(1+\alpha)c_{n-2(j+1)}\}+\alpha^2 r_{1,2j}+\alpha^2 c_{n-(2j+1)}]$$

$$1+\alpha[1+\alpha r_{0,2(j+1)}+\alpha^2 r_{1,2j}+c_{n-(2j+1)}]$$

$$=(1+\alpha)r_{1,2(j+1)}$$

and thus $$r_{2,2(j+1)}=\alpha r_{0,2(j+1)}+(1+\alpha)r_{1,2(j+1)}+\alpha^4(r_{2,2j}+c_{n-(2j+1)})$$

It can be shown, through matrix manipulation using operations over GF($2^M$) that these relationships hold for all values of R and L, with $$r_{0,2(j+1)} = \alpha^{2L}(r_{0,2j} + c_{n-(2j+1)}) + \alpha^L c_{n-2(j+1)}$$

$$r_{i,2(j+1)} = \alpha r_{i-2,2(j+1)} + (1+\alpha)r_{i-1,2(j+1)} + \alpha^{2(i+L)}(r_{i,2j} + c_{n-(2j+1)})$$

$$= \alpha(r_{i-2,2j+1} + r_{i-1,2(j+1)}) + r_{i-1,2(j+1)} +$$

$$\alpha^{2(i+L)}(r_{1,2j} + c_{n-(2j+1)})$$

and $$r_{i,2(j+1)}+r_{i-1,2(j+1)}=\alpha(r_{i-1,2(j+1)}+r_{j+1})+\alpha^{2(i+L)}(r_{i,2j}+c_{n-(2j+1)})$$

where $r_{-1,2(j+1)}=0$

We then define a recurrence relation $W_j$ and its auxiliary $\tilde{W}_j$ for $i \geq 1$ as:

$$W_{0,j}=\alpha^{2L}(r_{0,j-1}+c_{n-(2j+1)})+\alpha^L c_{n-2j}$$

$$W_{i,j}=W_{i-1,j}+\alpha \tilde{W}_{i-1,j}+\alpha^{2(L+1)}(W_{i,j-1}+c_{n-(2j+1)})$$

with $$\tilde{W}_{i,j}=\alpha \tilde{W}_{i-1,j}+\alpha^{2(L+i)}(W_{i,j-1}+c_{n-(2j+1)})$$

and $W_{-1,j}=0$.

Using the recurrence relation $W_j$ and the recurrence relation $V_j$ discussed above with reference to FIG. 3 with $W_{i,k+j}$ in place of $T_{i,k+j}$, we construct a parallel input/parallel output system that uses fewer XOR than the system of FIG. 3 to produce pairs of redundancy symbols in each clock cycle k+1, k+2 . . . .

Referring to FIG. 7, the information symbols are supplied in pairs to the input lines 100 and 102, with switches $k_1$, $k_2$ and $k_3$ in position 1, and switch $k_4$ in position 2 to disable the AND gates 220. The information symbol $c_{n-1}$ is supplied to update adders 108, which combine the symbol with the contents of the associated registers 106 and supply the sums to the associated Galois Field multipliers 210. The respective Galois Field multipliers 210 multiply the sums by $\alpha^{2L}$, $\alpha^{2(L+1)} \ldots \alpha^{2(L+R-1)}$ and supply the products to the feedback adders 214, which operate as a chain through AND gates 218.

At the same time, the information symbol $C_{n-2}$ is supplied to the Galois Field multiplier 211' in the first stage 104. The multiplier 211' multiplies the symbol by $\alpha^L$ and supplies the product to both chains of adders 209 and 214. The sum propagating through the chain of feedback adders 214, which is $\tilde{W}_{i,j}$ is combined into the sum propagating through the update adders 209, to produce $W_{i,j}$. This sum is then used to update the respective registers 106.

The chain of feedback adders 214 includes Galois Field multipliers 213, which multiply the propagating sum by a in each stage to produce $\alpha \tilde{W}_{i,j}$. The multipliers 213 may be constructed as shift registers that shift the respective sums to the right by one position.

After the last pair of information symbols is supplied to the system over lines 100 and 102, the switch $k_4$ is moved to position 1. The recurrence relation $V_j$ is then calculated using Galois Field multipliers 211 and the chain of feedback adders 215. At the end of this clock cycle, the system produces in the last stage the first two redundancy symbols $c_{R-1}$ and $c_{R-2}$. These symbols are then fed back to the input lines 100 and 102 and are further encoded to produce the next two redundancy symbols, and so forth. At the end of $$\frac{2k+R}{2}$$

clock cycles, the system has produced all R of the redundancy symbols.

For syndrome generation, the switches $k_1$ and $k_4$ are in position 2 and the remaining switches are in position 1. We discuss first the decoding of a codeword with an odd number of codeword symbols, and then the decoding of a codeword with an even number of codeword symbols.

Figure 8:
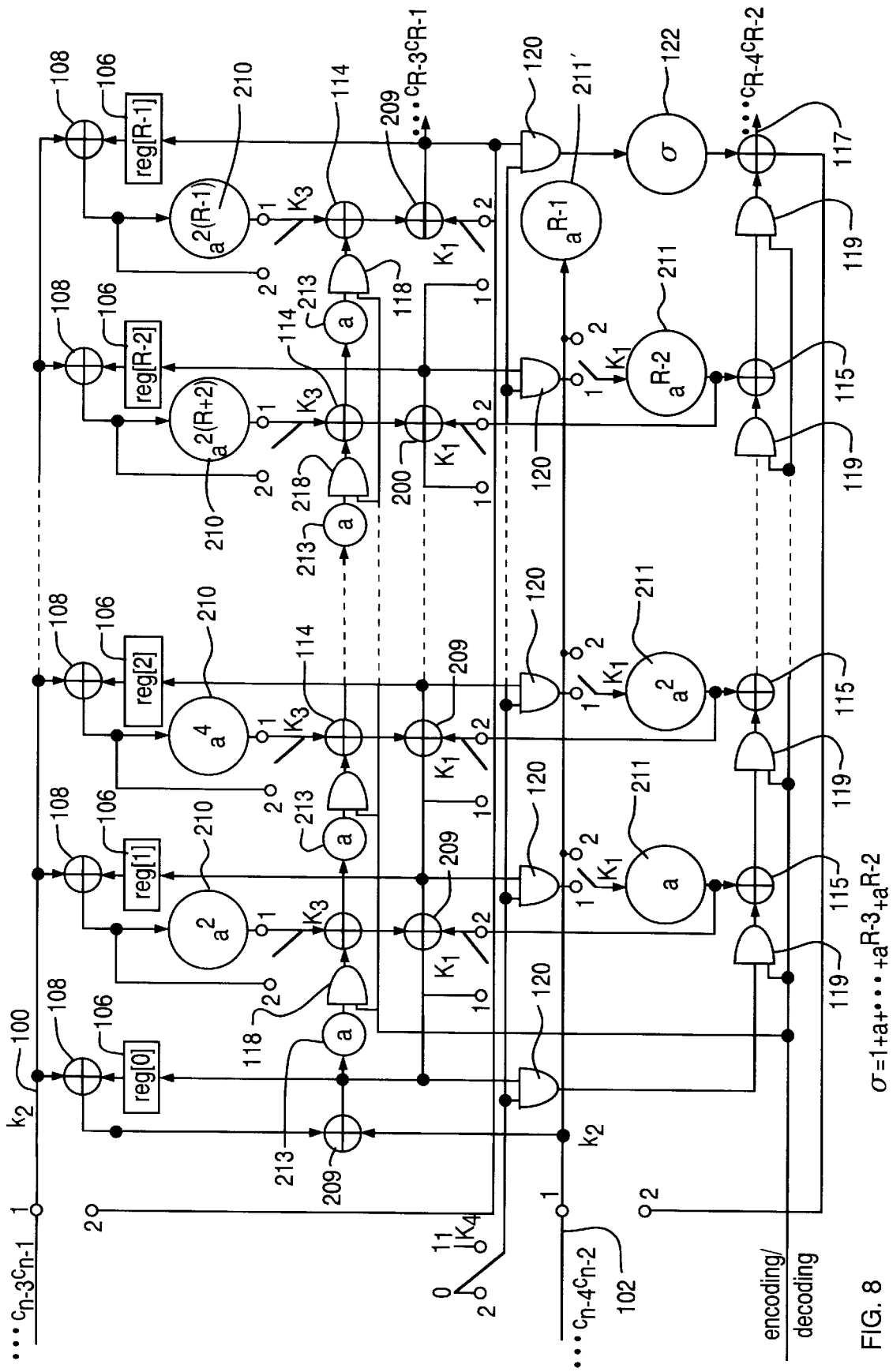
FIG. 8 depicts the system of FIG. 7 set up to decode a code word with an odd number of symbols.

Referring now to FIG. 8, the system of FIG. 7 is depicted with L=0, and the switches in the appropriate positions for decoding. Note that Galois Field multipliers 211' are now included in the calculations.

Consider the example of n=5, which has the syndrome $$S_i=\alpha^{4i}c_4+\alpha^{3i}c_3+\alpha^{2i}c_2+\alpha^i c_1+c_0.$$

The registers 106 are updated as the codeword symbols are encoded as:

$$W_{i,0}=0$$

$$W_{i,1}=\alpha^{2i}c_4+\alpha^i c_3$$

$$W_{i,2}=\alpha^{2i}(W_{i,1}+c_2)+\alpha_i c_1=\alpha^{4i}c_4+\alpha^{3i}c_3+\alpha^{2i}c_2+\alpha^i c_1$$

The bypass switches $k_3$ are then moved to position 2, such that the last codeword symbol, which is supplied online 102, is supplied directly to update the registers 106, and $$W_{i,3}=W_{i,2}+C_0$$

In general, when n is odd, that is when n−1=2k, $$W_{i,b} = \sum_{j=0}^{2b-1} \alpha^{(2b-j)i} c_{2k-j} \qquad 1 \leq b \leq k$$

and with the bypass switches, $$W_{i,k+1} = W_{i,k} + c_0 = \sum_{j=0}^{2k} \alpha^{ji} c_j + c_0 = S_i$$

Figure 9:
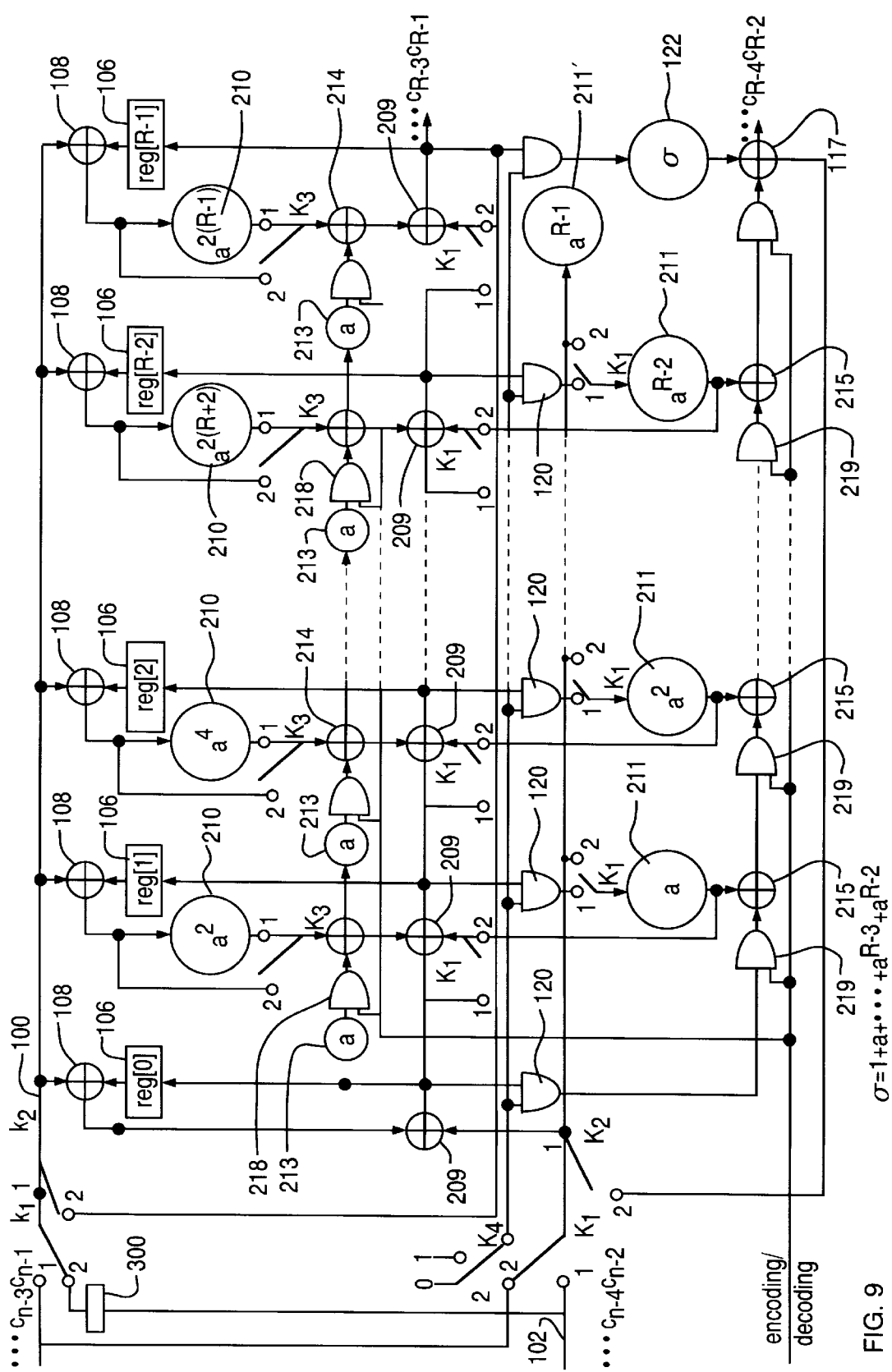
FIG. 9 depicts the system of FIG. 7 set up to decode a codeword with an even number of symbols.

When n is even, n−1=2k−1 and a delay is required in the input line 102 during decoding. Referring now to FIG. 9, during a decoding operation the codeword symbols on input line 100 are supplied through switches $k_1$ and $k_2$ to update adders 109, while the codeword symbols on line 102 are supplied to update adders 108 through a delay 300. As an example, for n=6, the registers are updated as:

$$W_{i,0}=0$$

$$W_{i,1}=\alpha^{2i}0+\alpha^i c_5$$

$$W_{i,2}=\alpha^{2i}(W_{i,1}+c_4)+\alpha^i c_3=\alpha^{3i}c_5+\alpha^{2i}c_4+\alpha^i c_3$$

$$W_{i,3}=\alpha^{2i}(W_{i,2}+c_2)+\alpha^i c_1=\alpha^{5i}c_5+\alpha^{4i}c_4+\alpha^{3i}c_3+\alpha^{2i}c_2+\alpha^1 c_1$$

The bypass switches $k_3$ are then moved to position 2, to bypass the multipliers 210, and the codeword symbol $c_0$ directly updates the registers 106. Accordingly, $$W_{i,4}=W_{i,3}+C_0=S_i$$

and the error syndromes are contained in the registers at the start of the $$\frac{2k+R}{2}+1$$

clock cycle. As is understood by those skilled in the art, the switches and the delay used for decoding a codeword with an even number of symbols may be included in the system of FIG. 7, such that the system may be used to decode codewords with even and/or odd numbers of symbols.

Figure 10:
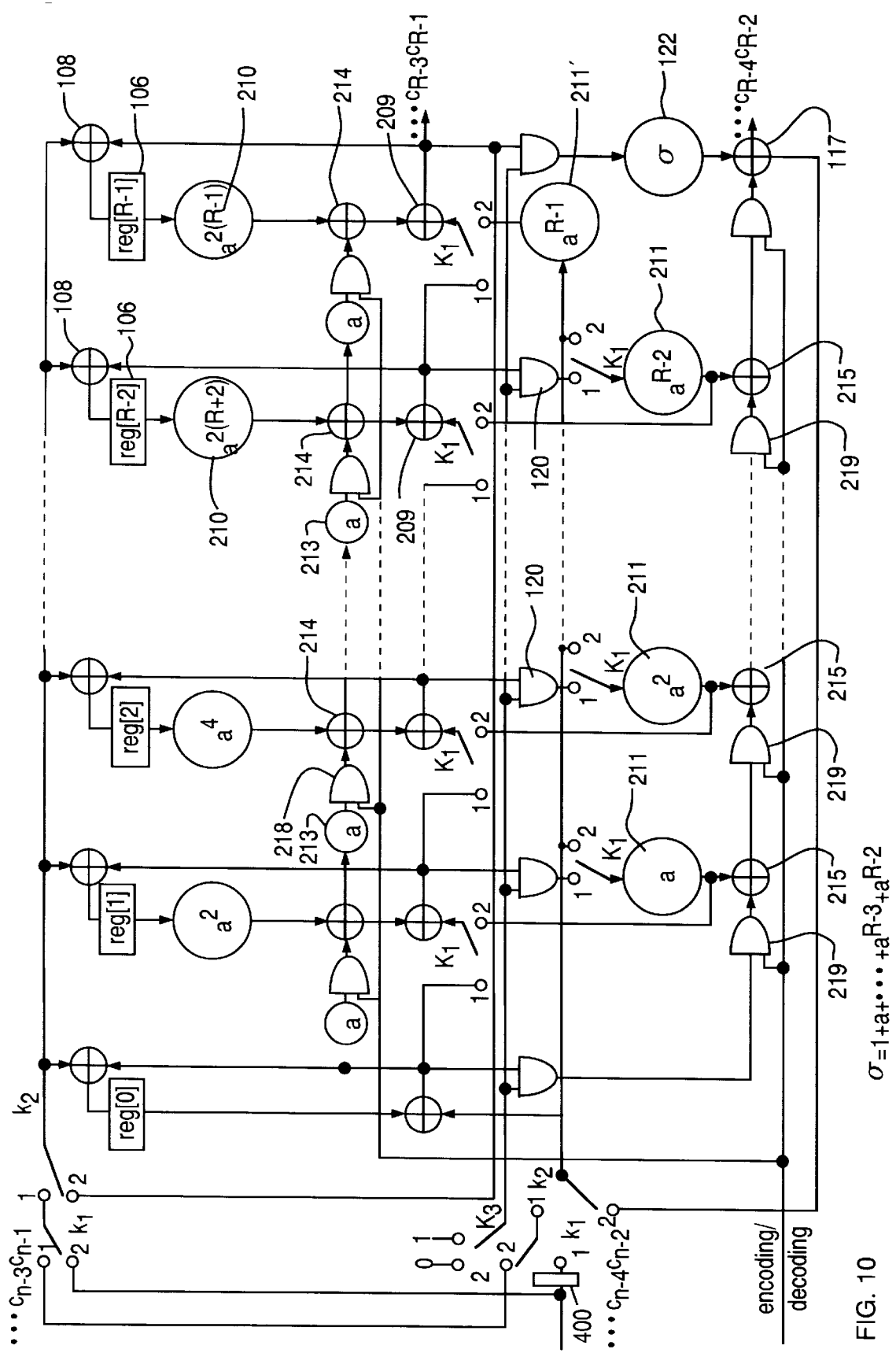
FIG. 10 depicts an equivalent system to the system of FIG. 7.

FIG. 10 depicts an equivalent system to the system of FIG. 7. This system decodes without bypass switches $k_3$, but requires a delay 400 for use during encoding, as discussed above with reference to FIG. 5.

What is claimed is:

1. A system for encoding codeword symbols in pairs in accordance with a generator polynomial $g(x)=(x-\alpha^L)(x-\alpha^{L+1})\ldots(x-\alpha^{j+R-1})$, the system including:

A. means for producing in a first stage of the system two values $$T_{0,j}=\alpha^L(c_{n-2j}+\alpha^L(c_{n-(2j-1)}+T_{0,j-1}))$$
   $$\tilde{T}_{0,j}=\alpha^L(c_{n-(2j-1)}+T_{0,j-1})$$

where $c_{n-2j}$ and $c_{n-(2j-1)}$ are the pair of codeword symbols that are encoded during a $j^{th}$ clock cycle;

B. means for producing in successive stages two to R−1 of the system two values $$T_{i,j}=T_{i-1,j}+\alpha^{L+i}(c_{n-2j}+\tilde{T}_{i-1,j}+\alpha^{L+i}(c_{n-(2j-1)}+T_{i,j-1}))$$
   $$\tilde{T}_{i,j}=\tilde{T}_{i-1,j}+\alpha^{L+i}(c_{n-(2j-1)}+T_{i,j-1}),$$

the system producing in stage R−1 at time $k^{th}$ the value $T_{R-1,k}$ which is a first redundancy symbol and $2k$ is the number of codeword information symbols;

C. means for producing in stages 0 to R−2

$$V_{i,j}=\sum_{b=0}^{i}\alpha^{L+b}T_{b,k+j}$$

And in stage $R-1 = \sum_{i=0}^{R-2}\alpha^{L+i}T_{i,k+j}+\sigma T_{R-1,k+j}$ where $$\sigma=\sum_{i=0}^{R-1}\alpha^{L+i},$$

said means producing at time k a second redundancy symbol $V_{R-1,k}$; and

D. means for feeding back to the stages the redundancy symbol values $T_{R-1,k+j}$ and $V_{R-1,j}$, the system producing the remaining redundancy symbols $c_{R-3}, c_{R-4} \ldots c_1, c_0$ in pairs.

2. The system of claim 1 wherein each stage includes feedback adders that operate in chains to propagate to a next stage the values $T_{i,j}$ and $\tilde{T}_{i-1,j}$.

3. The system of claim 2 wherein each stage further includes means for selectively disabling the feedback adders during decoding with each stage producing a syndrome value.

4. The system of claim 1 wherein the means for producing the values $T_{i,j}$ and $\tilde{T}_{i-1,j}$ in each stage i includes a. a register for storing $T_{i,j-1}$
   b. a pair of update adders for including the pair of codeword symbols in the values $T_{i,j}$ and $\tilde{T}_{i-1,j}$,
   c. one or more Galois Field multipliers for multiplying sums produced by the update adders by $\alpha^{L+i}$,
   d. a first chain of feedback adders for propagating $T_{i,j}$ to a next stage, and
   e. a second chain of feedback adders for propagating $\tilde{T}_{i-1,j}$ to a next stage.

5. The system of claim 4 wherein
   f. the means for producing $V_{i,j}$ in each stage i for i=0 to R−2 includes
      a Galois Field multiplier for multiplying $T_{i,k+j}$ by $\alpha^{L+i}$
      a third chain of feedback adders for combining the product produced by the Galois Field multiplier into a propagating sum and propagating the sum to the next stage,
      means for selectively coupling the Galois Field multiplier to the second chain of feedback adders, and
   g. the means for producing $V_{R+1,j}$ includes
      a Galois Field multiplier for multiplying $T_{R-1,k+j}$ by the constant $$\sigma=\sum_{i=0}^{R-1}\alpha^{L+1}$$

and
      an adder for adding the product produced by the Galois Field multiplier to the sum propagating through the third chain of feedback adders.

6. The system of claim 5 wherein each of the stages further includes means for preventing the propagating sums from propagating over the first and second chains of feedback adders, said means operating during decoding operations in which each stage produces a syndrome value.

7. The system of claim 6 further including means for bypassing one or more of the plurality of Galois Field multipliers when a last pair of codeword symbols is decoded.

8. The system of claim 6 further including a delay for delaying by one clock cycle the encoding of each of the codeword information symbols $c_{n-2b}$ for b=1,2 . . . k.

9. A system for encoding codeword symbols in pairs in accordance with a generator polynomial $g(x)=(x-\alpha^L)(x-\alpha^{L+1})\ldots(x-\alpha^{L+R-1})$, the system including:

A. means for producing in a first stage of the system a value $$W_{0,j}=\alpha^{2L}(W_{0,j-1}+c_{n-(2j+1)})+\alpha^L c_{n-2j}$$

where $c_{n-(2j+1)}$ and $c_{n-2j}$ are the pair of codeword symbols that are encoded during a $j^{th}$ clock cycle;

B. means for producing in stages two to R−1 the values $$W_{i,j}=W_{i-1,j}+\alpha\tilde{W}_{i-1,j}+\alpha^{2(L+i)}(W_{i,j-1}+c_{n-(2j+1)})$$

and $$\tilde{W}_{i,j}=\alpha\tilde{W}_{i-1,j}+\alpha^{2(L+i)}(W_{i,j-1}+c_{n-(2j+1)})$$

the system producing in stage R−1 at time k the value $W_{R-1,k}$ which is a first redundancy symbol, where 2k is the number of codeword information symbols.

10. The system of claim 9 further including:

C. means for producing in stages 0 to R−2

$$V_{i,j}=\sum_{b=0}^{i}\alpha^{L+b}W_{b,k+j}$$

and in stage R−1

$$V_{R-1,j}=\sum_{i=0}^{R-2}\alpha^{L+i}W_{i,k+j}+\sigma W_{R-1,k+j}$$

where $$\sigma=\sum_{i=0}^{R-1}\alpha^{L+i},$$

said means producing a second redundancy symbol at time k, and

D. means for feeding the redundancy symbol values $W_{R-1,k+j}$ and $V_{R-1,j}$ back to the stages, the system producing the remaining redundancy symbols $c_{R-3}, c_{R-4} \ldots c_1, c_0$ in pairs.

11. The system of claim 10 wherein the means for producing $W_{i,j}$ and $\tilde{W}_{i-1,j}$ in each stage includes a. an update adder for combining the codeword symbols with $W_{i,j-1}$,
b. a first Galois Field multiplier for multiplying the sum produced by the update adder by $\alpha^{2(L+i)}$,
c. a first chain of feedback adders for producing $\alpha\tilde{W}_{i-1,j}$, and
d. a second chain feedback adders for producing $W_{i,j}$.

12. The system of claim 10 wherein the stages include means for selectively preventing the two chains of feedback adders from propagating the values $W_{i,j}$ and $\tilde{W}_{i-1,j}$ to a next stage during decoding operations, with each stage producing a syndrome value.

13. The system of claim 11 wherein each of R−2 stages further includes e. a second Galois Field multiplier for multiplying the sum propagating through the second chain of feedback adders by $\alpha^{L+I}$,
f. means for selectively coupling the second Galois Field multiplier to the second chain of feedback adders,
g. a third chain of feedback adders for combining the product produced by the second Galois Field multiplier into a propagating sum, and
h. in a last stage, a third Galois Field multiplier for multiplying the sum
i. propagating through the third chain of feedback adders by the constant $$\sigma=\sum_{i=0}^{R-1}\alpha^{L+I},$$

and a last feedback adder for combining the product with the sum propagating through the third chain of feedback adders.

14. The system of claim 13 wherein the stages further include means for selectively preventing the first and third chains of feedback adders from propagating the values to a next stage during decoding operations, with each stage producing a syndrome value.

15. The system of claim 14 wherein each stage further includes means for bypassing one or more of the Galois Field multipliers when a last pair of codeword symbols is supplied to the system.

16. The system of claim 9 further including a delay for delaying by one clock cycle the encoding of each of the codeword information symbols $c_{n-2b}$ for b=1,2 . . . k.

17. A method of encoding codeword symbols in pairs in accordance with a generator polynomial $g(x)=(x-\alpha^L)(x-\alpha^{L+1}) \ldots (x-\alpha^{L+R-1})$, the method including the steps of:

A. producing two values $$T_{0,j}=\alpha^L(c_{n-2j}+\alpha^L(c_{n-(2j-1)}+T_{0,j-1}))$$
$$\tilde{T}_{0,j}=\alpha^L(c_{n-(2j-1)}+T_{0,j-1})$$

where $c_{n-2j}$ and $c_{n-(2j-1)}$ are the pair of codeword symbols that are encoded during a $j^{th}$ clock cycle;

B. producing successively two values $$T_{i,j}=T_{i-1,j}+\alpha^{L+i}(c_{n-2j}+\tilde{T}_{i-1,j}+\alpha^{L+i}(c_{n-(2j-1)}+T_{i,j-1}))$$
$$\tilde{T}_{i,j}=\tilde{T}_{i-1,j}+\alpha^{L+i}(c_{n-(2j-1)}+T_{i,j-1}),$$

to produce at time k the value $T_{R-1,k}$ which is a first redundancy symbol where 2k is the number of codeword information symbols;

C. successively producing $$V_{i,j}=\sum_{b=0}^{i}\alpha^{L+b}T_{b,k+j}$$

for i=0, 1, . . . R−2

D. producing $$V_{R-1,j}=\sum_{i=0}^{R-2}\alpha^{L+i}T_{i,k+j}+\sigma T_{R-1,k+j}$$

where $$\sigma=\sum_{i=0}^{R-1}\alpha^{L+i},$$

and at time k $V_{R-1,k}$ is a second redundancy symbol, and

E. feeding back the redundancy symbol values $T_{R-1,k+j}$ and $V_{R-1,j}$, to producing the remaining redundancy symbols $c_{R-3}, c_{R-4}, \ldots c_1, c_0$ in pairs in successive clock cycles.

18. The method of claim 17 further including the step of producing syndromes by successively decoding pairs of code word symbols.

19. The method of claim 18 further including the step of producing the syndromes by updating a value calculated in a previous clock cycle by a. combining the value with a first code word symbol from the pair of symbols and multiplying the sum by a root of the generator polynomial,
b. combining the product with the second code word symbol of the pair and multiplying the result by the root of the generator polynomial, and
c. retaining the sum for updating in a next clock cycle.

20. The method of claim 19 further including a step of bypassing one or more of the multiplication steps with a codeword symbol of the last pair of symbols.

21. The method of claim 18 further including delaying one of the pair of codeword symbols by one clock cycle relative to the other symbol in the pair.

22. A method for encoding codeword symbols in pairs in accordance with a generator polynomial $g(x)=(x-\alpha^L)(x-\alpha^{L+1})\ldots(x-\alpha^{L+R-1})$, the method including the steps of:

A. producing a value $$W_{0,j}=\alpha^{2L}(W_{0,j-1}+c_{n-(2j+1)})+\alpha^L c_{n-2j}$$

where $c_{n-(2j+1)}$ and $c_{n-2j}$ are the pair of codeword symbols that are encoded during a $j^{th}$ clock cycle;

B. producing $$W_{i,j}=W_{i,l,j}+\alpha\tilde{W}_{i-1,j}+\alpha^{2(L+i)}(W_{i,j-l}+c_{n-(2j+l)})$$

and $$\tilde{W}_{i,j}=\alpha\tilde{W}_{i-1,j}+\alpha^{2(L+i)}(W_{i,j-l}+c_{n-(2j+l)})$$

with the value $W_{R-1,k}$ being a first redundancy symbol, and 2k is the number of information symbols in the codeword.

23. The method of claim 22 further including:

C. producing for $i=0,1,\ldots R-2$ $$V_{i,j} = \sum_{b=0}^{i} \alpha^{L+b} W_{b,k+j}$$

and

D. producing for $i=R-1$ $$V_{R-1,j} = \sum_{i=0}^{R-2} \alpha^{L+i} W_{i,k+j} + \sigma W_{R-1,k+j}$$

where $$\sigma = \sum_{i=0}^{R-1} \alpha^{L+i},$$

and $V_{R-1,j}$ at time k is a second redundancy symbol; and

E. feeding back pairs of redundancy symbols to produce the remaining redundancy symbols $c_{R-3}, c_{R-4}\ldots c_1, c_0$ in pairs in successive clock cycles.

24. The method of claim 22 further including the step of producing syndromes by successively decoding pairs of code word symbols.

25. The method of claim 24 further including the step of producing the syndromes by updating a value calculated in a previous clock cycle by combining the value with a first code word symbol from the pair of symbols and multiplying the sum by an associated power of $\alpha$, combining the product with the second code word symbol of the pair and multiplying the result by an associated root of the generator polynomial, and retaining the sum for updating in a next clock cycle.

26. The method of claim 25 further including a step of bypassing one or more of the multiplication steps with the a codeword symbol of the last pair of symbols.

27. The method of claim 22 further including delaying one of the pair of codeword symbols by one clock cycle relative to the other symbol in the pair.

28. A system for decoding codeword symbols in pairs in accordance with a generator polynomial $g(x)=(x-\alpha^L)(x-\alpha^{L+1})\ldots(x-\alpha^{1+K-1})$ to produce error syndromes, the system including in each of R stages:

A. multiplication and addition means for producing $$T_{i,j}=\alpha^{L+i}(c_{n-2j}+\alpha^{L+i}(c_{n-(2j-1)}+T_{i,j-1}))$$

where $c_{n-2j}$ and $c_{n-(2j-1)}$ are the pair of codeword symbols that are decoded during a $j^{th}$ clock cycle and $i=0, 1, 2\ldots R-1$;

B. a bypass switch that during the clock cycle in which a last code word symbol is decoded bypasses
the multiplication operation associated with the last code word symbol, when n is even, to produce at each stage an associated error syndrome, or
both multiplication operations associated with the last code word symbol, when n is odd, to produce at each stage an associated error syndrome.

29. A method of decoding codeword symbols in pairs in accordance with a generator polynomial $g(x)=(x-\alpha^L)(x-\alpha^{L+R-1})\ldots(x-\alpha^{L+R-1})$ to produce error syndromes, the method including the steps of:

A. producing at each stage $$T_{i,j}=\alpha^{L+i}(c_{n-2j}+\alpha^{L+i}(c_{n-(2j-1)}+T_{i,j-1}))$$

where $c_{n-2j}$ and $c_{n-(2j-1)}$ are the pair of codeword symbols that are decoded during a $j^{th}$ clock cycle; and B. bypassing during the clock cycle in which the last code word symbol is decoded
the multiplication operation associated with a last code word symbol, when n is even, to produce at each stage a corresponding error syndrome, or
both multiplication operations associated with a last code word symbol, when n is odd to produce at each stage a corresponding error syndrome.

* * * * *